United States Patent
Rhodin

(10) Patent No.: US 9,063,201 B2
(45) Date of Patent: Jun. 23, 2015

(54) BATTERY CHARGE DETERMINATION

(75) Inventor: Daniel Rhodin, Eslöv (SE)

(73) Assignee: ST-Ericsson SA, Plan-les-Ouates (CH)

( * ) Notice: Subject to any disclaimer, the term of this patent is extended or adjusted under 35 U.S.C. 154(b) by 509 days.

(21) Appl. No.: 13/524,866

(22) Filed: Jun. 15, 2012

(65) Prior Publication Data

US 2012/0323512 A1    Dec. 20, 2012

Related U.S. Application Data

(60) Provisional application No. 61/500,420, filed on Jun. 23, 2011.

(30) Foreign Application Priority Data

Jun. 16, 2011  (EP) .................................... 11170238

(51) Int. Cl.
G01R 31/36    (2006.01)

(52) U.S. Cl.
CPC ........ G01R 31/3624 (2013.01); *G01R 31/3651* (2013.01); *G01R 31/3662* (2013.01)

(58) Field of Classification Search
CPC ................ G01R 31/36; G01R 31/361–31/362; G01R 31/3606; G01R 31/3648; G01R 31/3651; G01R 31/3662; G01R 31/3624; G06F 1/26; G06F 1/28; H01M 10/44; H01M 10/4257; H01M 2010/4271

See application file for complete search history.

(56) References Cited

U.S. PATENT DOCUMENTS

| | | |
|---|---|---|
| 2003/0076109 A1 | 4/2003 | Verbrugge et al. |
| 2006/0022643 A1 | 2/2006 | Brost et al. |
| 2007/0096697 A1 | 5/2007 | Maireanu |
| 2011/0057586 A1 | 3/2011 | Bucur |

FOREIGN PATENT DOCUMENTS

| | | |
|---|---|---|
| CN | 1979207 A | 6/2007 |
| EP | 1548453 A1 | 6/2005 |
| KR | 20070076316 A | 7/2007 |

OTHER PUBLICATIONS

Windarko et al., SOC Estimation Based on OCV for NiMH Batteries Using an Improved Takacs Model, Mar. 2010, Journal of Power Electronics, vol. 10, No. 2, pp. 181-186.*
Pop et al., State-of-Charge Indication in Portable Applications, Jun. 20-23, 2005, IEEE ISIE 2005, Dubrovnik, Croatia, pp. 1007-1012.*

* cited by examiner

*Primary Examiner* — Toan Le
(74) *Attorney, Agent, or Firm* — Coats & Bennett, PLLC

(57) ABSTRACT

A method of determining a current state of charge of a battery having an internal resistance includes estimating the current state of charge of the battery at a current time as a function of a previous state of charge of the battery at a previous time, a battery voltage of the battery during a time interval between the previous time and the current time, and a value of the internal resistance of the battery. The method improves the determining of the current state of charge of a battery.

12 Claims, 3 Drawing Sheets

BATTERY CHARGE DETERMINATION

The present application claims priority to European Patent Application EP 11170238.7, titled "Battery Charge Determination," filed with the European Patent Office on Jun. 16, 2011, and U.S. Provisional Patent Application Ser. No. 61/500,420, filed Jun. 23, 2011, titled "Battery Charge Determination," the disclosures of both of which are incorporated herein by reference in their entireties.

FIELD OF INVENTION

The present invention relates generally to the field of battery charge determination, and more particularly to a method, program and device for determining a current state of charge of a battery.

BACKGROUND

Battery charge determination, also known as "battery fuel gauging", designates a process of determining the remaining charge in a battery. The information about a current state of charge of a battery may be displayed, for example during the use of a device functioning with the battery. This way, any user of the device may verify the remaining charge of the battery and take decisions regarding the use of the device accordingly.

Different ways of determining the current state of charge of a battery exist in the art. Some methods rely on voltage versus state of charge lookup tables. Such methods comprise measuring the voltage of the battery and determining the current state of charge as the state of charge associated to the measured voltage in the lookup table. Such methods may also comprise selecting the lookup table based on the temperature of the battery, which may be measured. However, these methods are not reliable in case the battery is in a charge or a discharge phase. Indeed, when the battery is in a charge or a discharge phase, the voltage varies in a non monotonic way with great amplitude (i.e. the voltage fluctuates a lot). Thus, there is no strong relationship between the voltage and the state of charge (in other words, different states of charge correspond to the measured voltage, rendering lookup tables unusable for determining an accurate state of charge).

For this reason, some methods, such as the ones disclosed in documents US 2011/057586 A1 and US 2007/096697 A1, determine the current state of charge of a battery relying on a shunt resistor in the battery path. The principle of these methods is to keep track of the charge provided by or to the battery. For a reliable determination, the value of the shunt resistor must be precisely known. This can either be done by using resistors with a low tolerance and thus a pre-known reliable value, or by calibrating the resistance.

Either way, the use of a shunt resistor makes the method costly. Another issue with thick-film shunt resistors is their temperature coefficient. Moreover, the presence of a shunt resistor creates a voltage drop in the circuit, which can be critical for nowadays devices. Indeed, there is a trade-off between the resistor value and the accuracy that is achievable. For accuracy reasons, the shunt resistance should be as high as possible. However, a high shunt resistance means potentially a high voltage drop, at least if the product has a need for high currents. Mobile phones and laptops are examples of products that require rather high peak currents. The obvious drawback with a shunt resistor is thus that an amount of power is dissipated in the shunt resistor. In particular, the voltage drop that is introduced can have a significant impact on the design in a device that is supplied from a single cell battery. Some of the emerging high capacity battery technologies have lower cell voltage, which might introduce the need for a boost circuit that normally consumes the additional capacity gained.

This is the case for LDO. Every mV counts when defining cut-off voltages and headroom for LDO. Indeed, when a complete system is defined, i.e. during the systemization phase of a product, it is preferred to make sure that all subsystems can be supplied with power. Normally, a wide range of LDO's (Low-dropout regulator) and buck converters are used. A linear, low-dropout regulator (LDO) can have a dropout voltage in the range of 40-100 mV (i.e, the voltage on the supply node typically needs to be at least 40-100 mV higher than the output voltage). The consumer that requires the highest voltage may define where the cut-off voltage is placed. The cut-off voltage is the voltage where an automatic shutdown of the device is triggered due to that the systems within the device can no longer be supplied properly. In a system supplied from a low-voltage battery, every mV additional voltage drop will move the cut-off voltage higher up in the V/SOC curve, meaning that the complete battery capacity is not utilized.

Also, when a shunt resistor is used, the shunt resistor is often placed on the negative electrode (anode). This makes the ground plane less perfect. This can raise issues, as the product's ground plane is not truly zero resistance towards the battery.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure, and is not intended to identify key/critical elements of embodiments of the invention or delineate the scope of the invention. The sole purpose of this summary is to present some concepts disclosed herein in a simplified form as a prelude to the more detailed description that is presented later.

According to one or more embodiments described and claimed herein, a method is presented for determining a current state of charge of a battery having an internal resistance. The method comprises estimating the current state of charge of the battery at a current time as a function of a previous state of charge of the battery at a previous time, a battery voltage of the battery during a time interval between the previous time and the current time, and a value of the internal resistance of the battery One embodiment relates to a method of determining a current state of charge of a battery having an internal resistance. The current state of charge ($SOC_{new}$) of the battery at a current time as a function of a previous state of charge ($SOC_{old}$) of the battery at a previous time, a battery voltage ($V_t$) of the battery during a time interval (t) between the previous time and the current time, and a value ($R_i$) of the internal resistance of the battery.

Another embodiment relates to a non-transient computer readable medium having recorded thereon program steps operative to cause a CPU to determine a current state of charge of a battery having an internal resistance. The program steps cause the CPU to perform the steps of estimating the current state of charge ($SOC_{new}$) of the battery at a current time as a function of a previous state of charge ($SOC_{old}$) of the battery at a previous time, a battery voltage ($V_t$) of the battery during a time interval (t) between the previous time and the current time, and a value ($R_i$) of the internal resistance of the battery.

Yet another embodiment relates to an electronic device. The device includes a battery having an internal resistance, memory, and a CPU operatively connected to the memory. The CPU is operative to estimate the current state of charge ($SOC_{new}$) of the battery at a current time as a function of a previous state of charge ($SOC_{old}$) of the battery at a previous time, a battery voltage ($V_t$) of the battery during a time interval (t) between the previous time and the current time, and a value ($R_i$) of the internal resistance of the battery.

DETAILED DESCRIPTION

Figure 1:
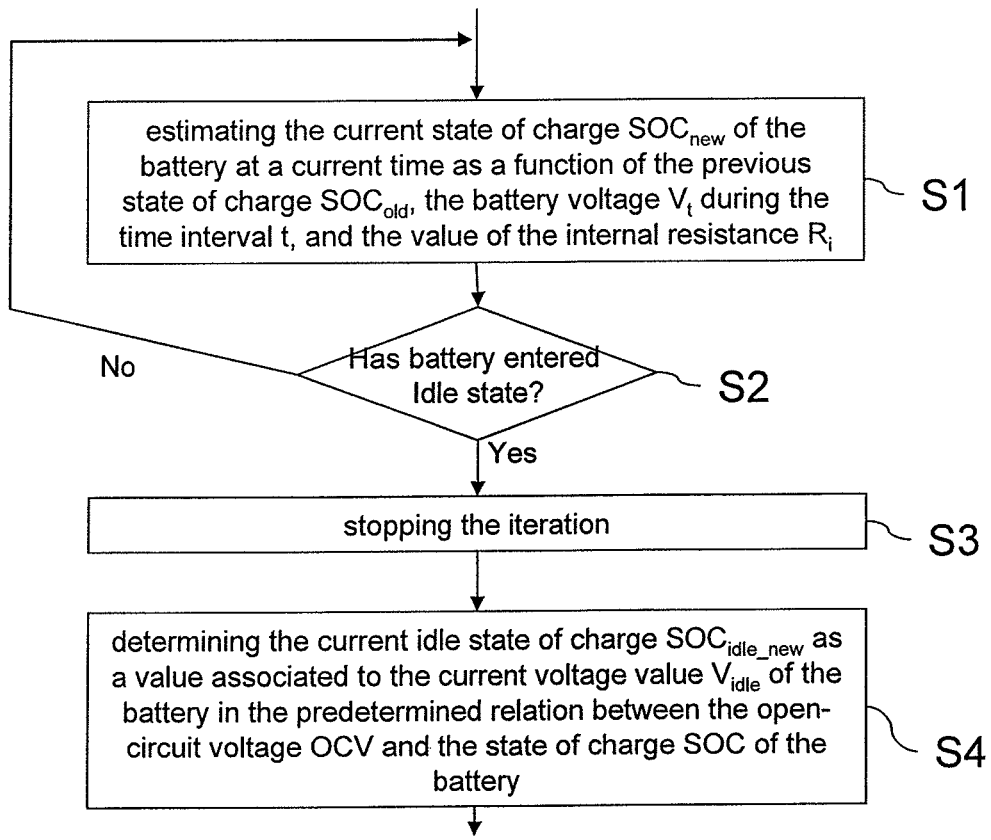
FIG. 1 shows a flowchart of the method for determining the current state of charge of a battery.

A method is provided for determining a current state of charge of a battery having an internal resistance. The method comprises estimating the current state of charge of the battery at a current time as a function of a previous state of charge of the battery at a previous time, a battery voltage of the battery during a time interval between the previous time and the current time, and a value of the internal resistance of the battery. Such a method is an improved way of determining the current state of charge of a battery. Notably, the method provides a fairly reliable determination of the current state of charge in a simple way.

The battery may be any type of battery having a state of charge. The state of charge designates here any value representing the remaining charge of the battery. The state of charge may be the absolute charge remaining in the battery (e.g. in Coulombs) or a ratio (e.g. in %) of the absolute charge remaining in the battery divided by a maximum absolute charge (i.e. the maximum Coulombs of the battery when the battery is fully charged). The maximum absolute charge may depend on the temperature at which the battery evolves, and/or the age of the battery. The method may thus comprise measuring the temperature of the battery and/or keeping track of the age of the battery in case such information are desired. Determining the current state of charge of a battery thereby means determining a value representing the charge of the battery at a given time, called the "current" time (or actual time).

This determination may serve different purposes. For example, the information may be presented to a user in order to make decisions as to how to use the battery (e.g. if the battery is included in a device, the user may want to stop using the device if the charge is low or start charging the battery). In another example, the information may be used by a device, which includes the battery, in order to automatically change its way of working, for example for sparing energy in case the state of charge is low.

The method performs the determination by estimating the real current state of charge. This means that the current state of charge determined at the end of the method is an estimation of the real current state of charge. The estimation may thus be different from the real current state of charge. The estimating of the current state of charge is referred to as "the estimating (E)" in the following for the sake of convenience.

The estimating (E) is performed as a function of several arguments. The term "function" designates any process based on several inputs providing, as an output, (an estimation of) the current state of charge. The process may provide the output via intermediate outputs, the intermediate outputs being themselves inputs for sub-processes of the process leading to the output. The arguments of the function are inputs or intermediate outputs.

These arguments include the previous state of charge of the battery at a previous time, which is any time anterior to the current time. Thus, the previous state of charge is a value that represents the charge of the battery at the previous time. The charge of the battery may evolve during the time interval elapsed from the previous time to the current time, and the method is for determining the state of charge reached at the end of this time interval, i.e. the current state of charge. The previous state of charge may be predetermined. For example, the method may comprise retrieving the previous state of charge from a hardware memory, e.g. a memory of a device including the battery.

The arguments of the function also include a battery voltage of the battery during the time interval. The "battery voltage of the battery during the time interval" designates any representation (e.g. by a value or by a set or values) of the voltage of the battery during the time interval. The battery voltage may be a value of the voltage at any time during the time interval, possibly the beginning, the end, and/or any other time such as the half-time of the time interval. The battery voltage may be an average of several values of the voltage during the time interval. The battery voltage may be a function V(t) of the voltage of the battery at a time t of the time interval (for example, in case such a function is predetermined by any type of model). The battery voltage may be an integral $\int V(t)dt$ of such function. The battery voltage may be derived from a voltage measure. For example, method may comprise measuring the battery voltage directly. In another example, the method comprises measuring a voltage elsewhere in a circuit, wherein the circuit includes the battery, and deducing the battery voltage from such measure. Deriving the battery voltage from a measure provides a fairly accurate battery voltage.

The arguments of the function also include at least one value of the internal resistance of the battery. The battery may indeed be modeled by an ideal voltage source in series with a resistance. The value of the internal resistance is the value of the resistance in series with the ideal voltage source in the model. The value of the internal resistance may be predetermined, constant or variable depending on operating conditions of the battery. For example, the method may comprise retrieving the value of the internal resistance from a hardware memory, e.g. a memory of a device including the battery. In any case that the value of the internal resistance is predetermined, the value may be predetermined as a constant. Alternatively, the value of the internal resistance may depend on different factors, such as the battery voltage during the time interval and/or the previous state of charge, and/or a temperature of the battery and/or the age of the battery. The method may thus comprise measuring the temperature of the battery and/or retrieving the age of the battery, e.g. from a hardware memory, and then selecting the value internal resistance value depending on such information.

As the estimating (E) relies on data such as the value of the internal resistance and a battery voltage during the time interval, the method provides a fairly accurate update of the state of charge of the battery in a non-complex way. The determination of the current state of charge may thus not rely on a shunt resistor. In an example, the method excludes any use of a shunt resistor. The value of the internal resistance, together with the battery voltage brings information that do not constitute a too great loss compared to any information brought by a shunt. Thus, a circuit including the battery and implementing the method need not have (and may thus exclude the presence of) a shunt resistor for determining the current state of charge. This saves costs without any significant loss of accuracy in the determination. Furthermore, the method does not imply a voltage drop, as no shunt need to be included. Furthermore, the method does not have any particular impact on the ground, which may stay as stable as without a shunt.

Estimating (E) the current state of charge may comprise estimating (E) a charge provided by or to the battery during the time interval as a function of the battery voltage and the value of the internal resistance. The charge provided by or to the battery may be homogeneous to the state of charge. For example, if the state of charge is a percentage of charge, then the charge is expressed as a percentage. Or, if the state of charge is an absolute charge, then the charge is expressed in absolute terms. The method may comprise charging or discharging the battery (for example as a result of connecting the battery to an electrical source or supplying power to a device including the battery). In such a case, a charge is provided to the battery (in the case of charging the battery), or a charge is provided by the battery (in the case of discharging the battery). The current state of charge may then be simply determined by subtracting or adding the charge provided by or to the battery during the time interval to the previous state of charge.

Estimating (E) the charge provided by or to the battery during the time interval may comprise determining a value representative of the difference between the battery voltage and an open-circuit voltage value of the battery during the time interval. The open-circuit voltage of the battery is defined as the voltage of the battery with no current, i.e. the voltage of the battery if the battery were fully relaxed. The open-circuit voltage of the battery defines the voltage of the ideal voltage source modeling the battery. The difference between the battery voltage and the open-circuit voltage value of the battery during the time interval is thus the voltage drop at the internal resistance of the battery during the time interval. The value representative of the difference between the battery voltage and an open-circuit voltage value of the battery during the time interval thus represents the voltage drop at the internal resistance of the battery during the time interval. By obtaining such a representation of the voltage of the internal resistance of the battery during the time interval, the method allows for determining the charge provided by or to the battery during the time interval, with the same principle of a shunt resistor but without using such a shunt resistor.

The open-circuit voltage of the battery during the time interval may be predetermined and thus constitute a further argument of the function used to estimate the current state of charge. However, for a more accurate estimation, determining the value representative of the difference may comprise determining the open-circuit voltage of the battery during the time interval as a value associated to the previous state of charge in a predetermined relation between the open-circuit voltage and the state of charge of the battery. The predetermined relation between the open-circuit voltage and the state of charge of the battery is any relation associating an open-circuit voltage value to a state of charge value of the battery. This may be a predefined function, for example if a model of such relation exists or is predetermined. This may alternatively be a predetermined lookup table. For example, tests are performed on at least one battery in laboratory to fill in such lookup table. These tests may include positioning the battery in a circuit requiring a very low current (e.g. inferior to 10 mA, preferably inferior to 8 mA, preferably, at least approximately, equal to 5 mA) and keeping track of both the remaining charge of the battery and the voltage of the battery by measuring such voltage. Indeed, with a low current, the voltage battery approximately equals the open circuit voltage of the battery. The tests may be performed with different battery temperatures and/or battery ages. In such a case, the method may comprise selecting the appropriate lookup table among several lookup tables which are defined for a given temperature and/or age of the battery, depending on a measured temperature and/or an age of the battery retrieved in a memory, e.g. a memory of a device including the battery.

For a simple and accurate determination, estimating (E) the current state of charge may comprise making several measures of the voltage of the battery over the time interval and determining the battery voltage of the battery during the time interval as an average of the several measures. The measures may be performed with an Analog-To-Digital Converter (ADC) or any other voltage measuring tool. In most electronic devices, an ADC is often present for measuring the battery voltage. Thus, the method provides a way for determining the battery voltage using tools already present in the device and is thus particularly convenient. The measures may be spread regularly over the time interval (i.e. with sub-intervals between the measures of equal length), so that the average is more representative. The measures may be performed at high frequency, for example higher than 20 kHz, e.g. with a sigma-delta ADC. This high frequency delivers a particularly accurate average voltage, as the true voltage may fluctuate a lot, by keeping track of such fluctuations, notably when the battery is powering a device e.g. due to the load from processors and RF peripherals.

The estimating (E) may be iterated (i.e. repeated) over a charge or a discharge phase of the battery. A charge phase of the battery is defined as a duration during which the battery is provided with at least a given minimum quantity of charge. A discharge phase of the battery is similarly defined as a duration during which the battery provides at least a given minimum quantity of charge. For example, a charge (discharge) phase may for example be a duration lasting over 1s, preferably 5s, where the state of charge is increased (decreased) by a given minimum quantity.

In such a case, at least some of the values of the arguments used at each iteration of the estimating (E) may be predetermined. Particularly, the current state of charge determined at each iteration of the estimating (E) may become the previous state of charge of the next iteration of the estimating (E). In effect, this means that the argument "previous state of charge" is updated at each iteration by replacing its value by the value of the current state of charge estimated in the previous iteration of the estimating (E). As for the first value used for the previous state of charge (for the initial iteration of the estimating (E)), it may be predetermined, e.g. as explained later. The internal resistance value may be predetermined. However, for a refined determination, the internal resistance value may vary from one iteration to the other, e.g. the internal resistance value to be used may depend on the value of the argument "previous state of charge" used for the current iteration of the estimating (E). As for the battery voltage, it may be measured as explained above each time the estimating (E) is iterated.

As opposed to the charge or discharge phase, the battery may be in an idle state. The idle state is a duration during which the charge provided by or to the battery evolves slowly (i.e. the variation of charge is below the given minimum quantity). In such a case, the method may further comprise stopping the iteration when the battery enters the idle state. The method may then comprise determining a current idle state of charge as a value associated to a current voltage value of the battery in a predetermined relation between the open-circuit voltage and the state of charge of the battery, the predetermined relation being as defined above. This allows a more efficient determination of the state of charge. Determining the state of charge by estimating (E) the state of charge as explained earlier is useful especially when the charge provided by or to the battery evolves quickly. Indeed, in such a case, the voltage of the battery fluctuates a lot and estimating (E) the state of charge rather than determining it directly with the predetermined relation provides a more accurate result. However, when the charge provided by or to the battery evolves slowly (i.e. the battery is in an idle state), it is more accurate and quicker to determine the state of charge directly from the predetermined relation and the current battery voltage value, which may easily be measured (e.g. the same way the battery voltage may be measured when estimating (E) the state of charge, e.g. with the same ADC).

Determining the current idle state of charge as a value associated to the current voltage value of the battery in the predetermined relation may be repeated more than twice over the idle state. Alternatively, determining the current idle state of charge as a value associated to the current voltage value of the battery in the predetermined relation may be performed only once, e.g. before exiting the idle state (for entering a charge or a discharge phase), or twice, e.g. before exiting the idle state and at the beginning of the idle state. Indeed in the idle state, as the discharge rate is usually very low, it is not useful to measure the voltage too often. In many applications the battery charge indicator is not even visible, as the display is turned off to save current. Thus it is enough to capture the voltage just before the device is leaving the idle state for higher efficiency. The idle state of charge determined before entering a charge or discharge phase may serve as the first value of the "previous state of charge" argument (i.e. the value used for the previous state of charge in the initial iteration of the estimating (E)).

The boundary between the charge or discharge phases and the idle state depends on how accurate determining the state of charge as a value associated to a current voltage value of the battery in the predetermined relation is. In other words, such boundary depends on how well the predetermined relation is applicable, i.e. it depends on how well the voltage of the battery may be approximated by the open-circuit voltage of the battery. This may depend on many parameters such as the type of the battery or the electrical components in a circuit including the battery.

In any case, the method may comprise detecting the idle state of the battery (i.e. detecting that the battery has entered the idle state after it was in a charge or a discharge phase) simply by detecting that an electric current provided by or to the battery has dropped below a predefined threshold. The threshold thus depends on the above-mentioned parameters and may be any value. In any case, such a threshold is predetermined, and may for example be stored on hardware memory and be accessed for performing the detection. As a non-limiting example, the threshold may be set to 10 mA. When in a charge or discharge phase, the method may include, as explained above, estimating (E) a charge provided by or to the battery during the time interval. In such a case, the method may for example comprise determining the average current, by dividing the value representative of the difference between the battery voltage and the open-circuit voltage value by the value of the internal resistance. The method may then comprise comparing this average current to the threshold, which may thus lead to exiting the repetition of the estimating (E) in a simple way.

Inversely, a way of detecting the entering into a charge or discharge phase (from an idle state) may comprise measuring the voltage in relatively short time intervals (for example every 10'th second), and as soon as the difference between two samples is above a certain threshold, detecting that the battery has entered a charge or discharge phase. The benefit with this method is that the power consumer need not wait to be served until the relaxed voltage has been measured.

Another way of detecting a charge or discharge phase is to use a hardware trigger that can detect if the device is about to consume or receive power. This could for example be based on clock requests, interrupts or requests to turn on power supplies. The benefit with this method is that no unnecessary measurements are made, thus sparing battery power.

Of course, for increasing the probability of detecting a charge or discharge phase, the method may comprise both ways (i.e. perform both tests and detect a charge of discharge phase when at least one of the tests is positive).

At this point, it has become apparent that the method may comprise estimating (E) the current state of charge based notably on the value of the internal resistance when the battery is in a charge or discharge phase, or determining the current state of charge directly with the predetermined relation when the battery is in an idle state, without using the internal resistance value. Also, examples of how to perform the transitions from (to) the charge or discharge phase to (from) the idle state have been provided, i.e. examples of how to detect a change of state, so that the method may be fully automatic.

In this case, the method may further comprise determining an improved internal resistance value as a function of the current idle state of charge, and a previous idle state of charge of the battery determined respectively after and (before or) at a beginning of the charge phase or the discharge phase. In other words, the method comprises improving the value used for the internal resistance, based on the (possible) correction provided by the direct use of the predetermined relation for determining the state of charge during the idle state. This allows a refined subsequent execution of the estimating (E).

For example, determining the improved internal resistance value may comprise determining an average electric current provided by or to the battery during the charge phase or the discharge phase. This average current may be determined by comparing the current idle state of charge to the previous idle state of charge. The average current may be the difference between the current idle state of charge and the previous idle state of charge, divided by the time elapsed (from the beginning of the charge phase or the discharge phase until the current time, i.e. when the battery enters the current idle state), the whole being multiplied by the maximum charge of the battery if states of charge are expressed as percentages.

The previous idle state of charge is the state of charge of the battery at the beginning of the charge or discharge phase. Indeed, the previous idle state of charge is the state of charge when the battery was in idle state just before entering the charge or discharge phase during which the estimating (E) is iterated. Thus, the previous idle state of charge is the first previous state of charge used during the repetition of the estimating (E), the one used at the first iteration. The current idle state of charge is the state of charge of the battery when it has exited the charge or discharge phase.

The previous idle state of charge and the current idle state of charge are both determined as a value associated to a voltage value of the battery in the predetermined relation during an idle state of the battery. Thus, the previous idle state of charge and the current idle state of charge are highly accurate values of the state of charge at two known times. Notably, determining the current idle state of charge with the predetermined relation instead of relying on the last current state of charge reached after iterating the estimating (E) is more accurate. Thus, using these accurate values and the known times, the method determines an accurate average electric current provided by or to the battery during the charge phase or the discharge phase, and in fine a more internal resistance value(s) which may advantageously be used in a next iterating of the estimating (E).

Then, the internal resistance value used for estimating (E) the state of charge during a next charge phase or a next discharge phase may be the improved resistance value or an average of values including the improved internal resistance value and at least one previously used resistance value. In the latter case, the method thus averages the improved value with previously used value(s) instead of using the improved value as such. This corrects the internal resistance value and allows a possibly automatic adaptation of the method as different charge or discharge phases are undergone by the battery.

The method may be performed based on a computer program comprising instructions for performing the method. The program is executable on a programmable device. The application program may be implemented in a high-level procedural or object-oriented programming language, or in assembly or machine language if desired. In any case, the language may be a compiled or interpreted language. The program may be a full installation program, or an update program. In the latter case, the program is an update program that updates a programmable device, previously programmed for performing parts of the method, to a state wherein the device is suitable for performing the whole method.

The program may be recorded on a data storage medium. The data storage medium may be any memory adapted for recording computer instructions. The data storage medium may thus be any form of nonvolatile memory, including by way of example semiconductor memory devices, such as EPROM, EEPROM, and flash memory devices; magnetic disks such as internal hard disks and removable disks; magneto-optical disks; and CD-ROM disks.

A device suitable for performing the method may be an electronic device comprising a battery and the data storage medium. Typically, the program is stored on at least one hardware memory of the device. The memory may also store any other information used by the method. For example, the memory may store information such as the previous state of charge, the battery voltage and the value of the internal resistance of the battery. Also, the memory may store the predetermined relation, the open-circuit voltage value and other information used in examples of the method. The memory is accessible by at least one Central Processing Unit (CPU) of the device. The CPU may execute the program and may thereby perform the method, without further programming of the device.

In an example, the device may further comprise an Analog-To-Digital converter (ADC) for measuring the battery voltage or any voltage from which the battery voltage may be simply derived by the processor. The ADC is possibly arranged for measuring the voltage of the battery, preferably by continuously sampling it, and more advantageously for continuously integrating the voltage of the battery. Such a device has the advantage of avoiding the need for a high-precision shunt resistor, which saves cost (all the more if the device has an ADC for any other purpose).

The device may further comprise a display unit, such as a screen, for example for displaying a representation of the determined state of charge. Typically, the method may comprise displaying the representation of the current state of charge on the screen, e.g. as a battery gauge.

The device may be a communication device. The device may thus comprise a signal emitter and a signal receiver. For example, the device may be a telephone. The device may be a wireless communication device. The device may be mobile (i.e. transportable). The device may for example be a mobile phone (e.g. a cell phone).

An example of the method is now described with reference to the flowchart of FIG. 1. In the example the method comprises estimating (S1) the current state of charge $SOC_{new}$ of the battery at a current time as a function of the previous state of charge $SOC_{old}$, the battery voltage $V_t$ during the time interval t, and the value of the internal resistance R. The estimating (S1) is thus fairly accurate and made without the use of a shunt resistor. The method then comprises testing (S2) if the battery Has battery entered an idle state. If the battery has not entered an idle state, the method iterates the estimating (S1). If on the contrary the battery has been detected to have entered an idle state, the method comprises stopping (S3) the iteration. The method of the example then comprises determining (S4) the current idle state of charge $SOC_{idle\_new}$ as a value associated to the current voltage value $V_{idle}$ of the battery in the predetermined relation between the open-circuit voltage OCV and the state of charge SOC of the battery. The determining (S4) provides a fast and accurate result. Thus; the method of the example offers a refined estimation throughout the life of the battery.

An example of performing the method with an example of the device will now be described with reference to FIGS. 2-6. It will be apparent from the example how the method can accurately estimate the state of charge charge (SOC) of the battery throughout the whole life of the battery, without the use of a current sensing resistor, by means of tracking the difference in voltage between a calculated Open Circuit Voltage (OCV) and the actual battery voltage.

Figure 2:
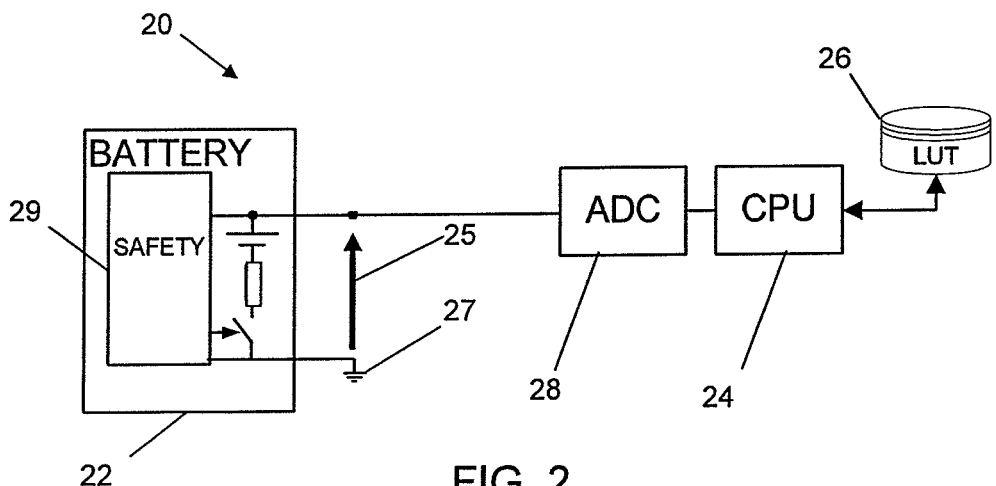
FIG. 2 shows a schematic representation of an example of a device.

FIG. 2 shows a schematic representation of the device 20 of the example. The device 20 comprises the battery 22, the CPU 24 and the memory 26. The device also comprises the program for performing the method which is stored on the memory 26 or on a local memory of the CPU 24. The device 20 of the example also comprises the ADC 28 which may be any type of ADC, for example a sigma-delta ADC. The ADC 28 is connected to the battery 22 and provides a measure of the battery voltage represented by arrow 25. For example, the ADC 28 may measure values of the battery voltage at a given frequency, and may then integrate the values and provide an average of the voltage over a given time interval (for example a time interval above 100 ms and/or below 200 ms, for example 125 ms). The CPU 24 is connected to the ADC 28 and may thus process the data provided by the ADC 28 for performing the method. The CPU 24 is also coupled to the memory 26 for read and/or write purposes and may thus access the data stored on the memory 26. In the example, the memory 26 stores a lookup table LUT. In this example, the battery 22 also comprises the safety 29. As can be seen, the device 20 does not comprise any shunt resistor, for example between the battery 22 and the ground 27. Thus, the device 20 is of simple and costless constitution.

Figure 3:
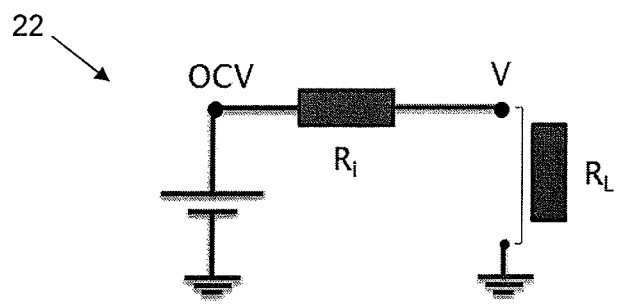
FIG. 3 shows a model of an example of a battery.

The example is based on using the knowledge of the open-circuit to State-Of-Charge (SOC) relationship. FIG. 3 represents a simplified model of the battery 22 of FIG. 2. The battery 22 has an internal resistance ($R_i$), that causes a voltage drop when current is drawn from the battery (i.e. charge is provided by the battery) or is provided to the battery (i.e. charge is provided to the battery). FIG. 3 also represents the battery voltage V and the open-circuit voltage of the battery OCV. The method uses the "virtual impedance" $R_i$ to determine current when appropriate: V may be measured with the ADC 25 of FIG. 2; OCV may be deduced from the state of charge SOC of the battery, the track of which can be kept in a memory; thereby the virtual voltage drop over $R_i$ may be estimated and lead to the current. $R_L$ represents the load that is supplied by the battery 22.

In this example, the way of determining the current SOC may depend on a state of the battery. The state of the battery may be determined by a battery manager, which is a module of the program. The battery manager may determine the state according to a transition graph. In a transition graph, the nodes are states and the arcs, which are directed, define transitions from one state to another state. An arc is followed by the battery (i.e. transition occurs) when a condition is met (e.g. a Boolean condition is evaluated to be "true").

Figure 4:
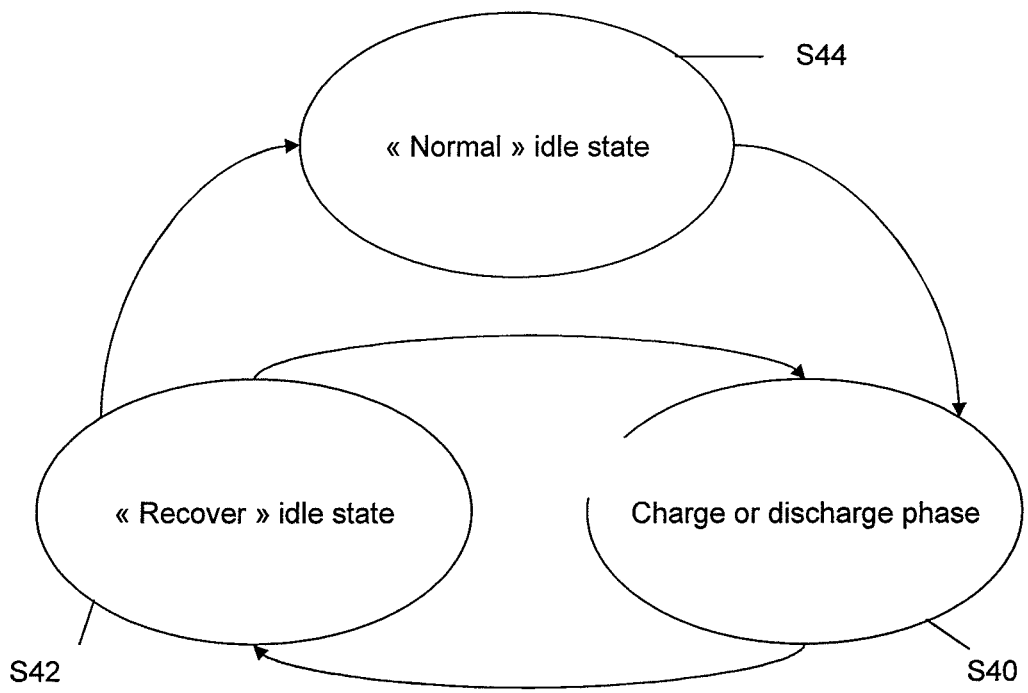
FIG. 4 shows an example of a transition graph of an example of a battery.

FIG. 4 shows an example of such a transition graph with arrows representing the transitions, which may apply to the battery 22 of FIGS. 2 and 3. In this example, the battery 22 may have three distinctive states: a state (S40) wherein the battery is in a charge or discharge phase, a "recover" idle state (S42) wherein the battery is in an idle state and launches recovery (which will be discussed later), and a "normal" idle state (S44) which is entered only from the "recover" idle state (S42) and only if recovery has correctly ended. The transitions from the idle states (S42, S44) to a charge or discharge phase S40 may occur when charge or discharge is detected, e.g. as explained earlier. The transition from a charge or discharge phase S40 to the recover idle state S42, S44 may occur when the idle state is detected, e.g. also as explained earlier.

Figure 5:
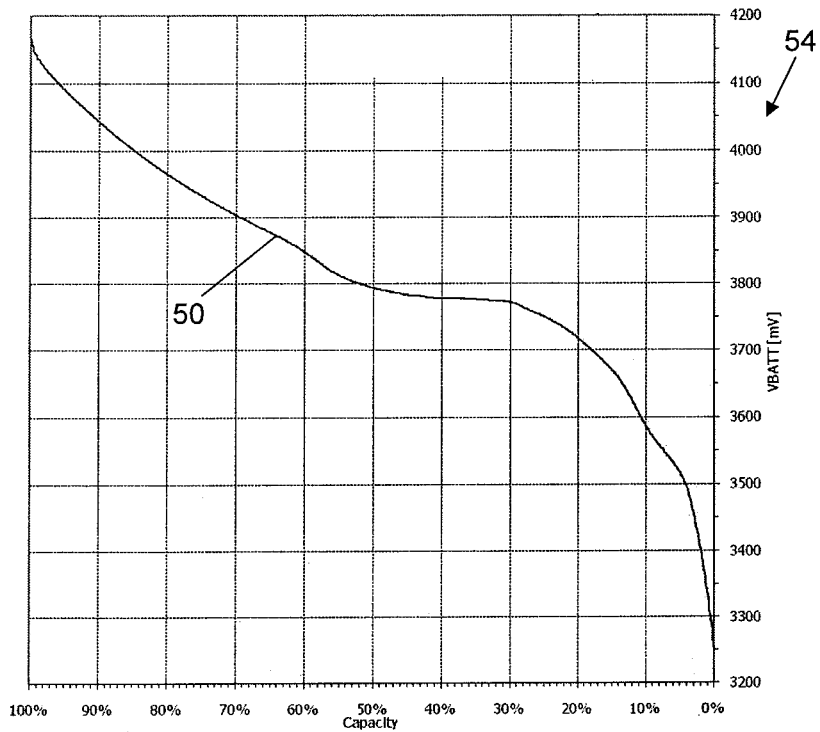
FIG. 5 shows a representation of an example of a predetermined relation between the open-circuit voltage and the battery voltage.

FIG. 5 shows a representation of an example of a predetermined relation between the open-circuit voltage (OCV) and the state of charge (SOC) of the battery 22. This representation may be translated into a lookup table. The SOC is expressed in percentage in this example. The lookup table may associate values 52 of OCV noted "VBATT" to values 54 of SOC noted "Capacity" by means of a table. The figure represents the lookup table as a curve 50 associating the VBATT values 52 of OCV to the Capacity values 54 of SOC. The lookup table has been obtained in this example with a current equal to 5 mA. In other words, the battery 22 has been submitted to a discharge current of 5 mA, and measures of the voltage as well as measures of the state of charge have been regularly performed in laboratory. Such a low current may indeed correctly approximate the open circuit. Thus, the voltage VBATT of the battery measured for computing curve 50 correctly approximates the open-circuit voltage. Thus, the predetermined relation may be an approximation of the exact relationship between the open-circuit voltage and the state of charge.

The lookup table represented by curve 50 of FIG. 5 allows to determine the SOC in an idle state, by measuring the battery voltage and retrieving the SOC value associated to the measured battery voltage from the lookup table. The lookup table also allows determining the OCV during a charge or discharge phase. This is explained with reference to FIG. 6.

Figure 6:
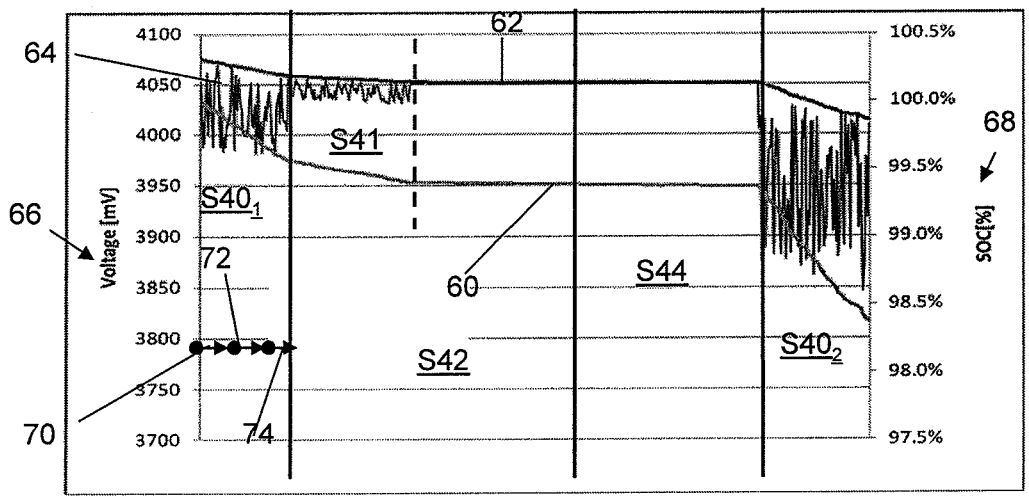
FIG. 6 shows a representation of examples of values obtained with an example of the method for determining the current state of charge of a battery.

FIG. 6 shows a representation of examples of values obtained with an example of the method for determining the current state of charge of the battery 22 during a discharge phase $S40_1$, a recover idle state S42, an idle state S44, and another discharge phase $S40_2$. Three consecutive time intervals (70, 72, 74) are represented by arrows during discharge phase $S40_1$. The SOC, the battery voltage and the OCV are respectively represented by curves 60, 64 and 62. The battery voltage and the OCV are to be read on voltage values 66, whereas the SOC has to be read on percentage values 68. As can be seen on FIG. 6, even in small time intervals, the voltage shown by curve 64 fluctuates a lot due to the load from processors and RF peripherals during the discharge phases.

The estimating (E) is now exemplified for time interval 72, during discharge phase $S40_1$. In the example, the method comprises determining an OCV value for 72. For example, the OCV corresponding in the lookup table, e.g. as represented on FIG. 5, to the previous state of charge, i.e. the current state of charge determined when previously performing the estimating (E) for time interval 70, is retrieved. The method of the example then comprises calculating $V_{diff}$ as the difference between OCV and the average of the battery V during the interval. $V_{diff}$ is directly proportional to the average current $I_{Avg}$ during time interval 72.

If we assert a previously stored internal resistance in the battery ($R_i$), the $V_{diff}$ can be used to calculate the average current $I_{Avg}$ during the interval time 72. Once the average current $I_{Avg}$ during the interval time 72 is known, the method of the example calculates the charge accumulated by the battery between $t_0$ and $t_0+t$ as AccCharge($t_0+t$)=AccCharge($t_0$)+($I_{Avg}*t$) (in Coulombs).

The method of the example then updates the SOC with a new value by applying: SOC % ($t_0+$=SOC % ($t_0$)+(PercentPerCoulomb*$I_{Avg}$* t), where 'PercentPerCoulomb' is 1/MaxCharge, i.e the inverse of the maximum coulombs in a fully charged battery, and SOC % is the state of charge of the battery expressed in percentage and being updated from the previous state of charge SOC % ($t_0$) to the current state of charge SOC % ($t_0+1$) when performing the method.

The method also updates and stores the mean value of $V_{diff}$ for each conversion, i.e. each calculation of the $V_{diff}$=OCV−V. The mean value of $V_{diff}$ may indeed be stored, as this integrates the mean difference between OCV and V, which is a measure of the average current over the virtual impedance $R_i$. Later on (in the recover idle state), this value may be used to compute the average current during the complete charge/discharge cycle, as discussed hereunder.

This value may be used in the recover idle state S42 which is now discussed. As discussed earlier, the method may comprise entering the recover idle state S42 when the current $I_{Avg}$ has dropped below a certain threshold to perform "recovery".

The method may comprise standing by for a predefined time. Indeed, the battery may need time, represented by time S41, before the voltage is fully relaxed and the battery voltage has reached a true relaxed open-circuit voltage (this corresponds to the dotted line at the end of S41 on the figure). Once equilibrium voltage has been reached, the method of the example comprises measuring the battery voltage and a new SOC value is determined as the value associated to the measured voltage in the lookup table. During the discharge phase represented on FIG. 6, the method may have miscalculated the real charge due to a non-perfectly accurate value of $R_i$. The difference between the SOC acquired after relaxation and the last estimated SOC when the recovery idle state was entered is noted $SOC_{Diff}$. This translates into a difference of charge of the battery (in Coulombs) between the beginning of the discharge phase and the end of the discharge phase by applying:

DiffCharge=($SOC_{Diff}$*MaxCharge)+AccCharge (in Coulombs).

The method may also keep track of the time T of how long the battery 22 was in the discharge phase $S40_1$, and can thereby calculate the average current during the complete discharge phase as: $I_{Avg}$=DiffCharge/T. The method may now comprise updating the internal resistance $R_i$ to a better value, by taking the mean of $V_{diff}$ and divide it with the average current: $R_i$=VdiffMean/$I_{Avg}$. This means that for the next charge/discharge phase $S40_2$, the method may use an improved value of $R_i$ to work with. When the improved value of $R_i$ is determined, the method may end "correctly" the recover idle state S42 and transit to the normal idle state S44.

During the normal idle state S44, the method of the example may regularly, or just before exiting the idle state S44, measure the voltage and deduce the SOC as the associated value to the measured voltage in a lookup table based on FIG. 5. This is done until the battery 22 enters again a charge or a discharge phase, discharge phase $S40_2$ in the example, wherein the above explanations referring to $S40_1$ may apply again for determining the current state of charge.

Embodiments of the present invention present numerous advantages over the prior art. Embodiments of the present invention allow a simple and efficient determination of the current state of charge as an estimated state of charge. Additionally, thanks to the battery voltage of the battery during the time interval elapsed from the previous time and the current time, and the value of the internal resistance of the battery, methods according to embodiments of the present invention allow the update of the state of charge, from the previous state of charge into the current state of charge. Furthermore, as the estimation relies on data such as the value of the internal resistance and the previous state of charge, the embodiments of the present invention allow a fairly reliable determination of the current state of charge.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method for determining a current state of charge of a battery having an internal resistance, comprising:
  during a charge or discharge phase, iteratively estimating, in a CPU, the current state of charge ($SOC_{new}$) of the battery at a current time as a function of a previous state of charge ($SOC_{old}$) of the battery at a previous time, a battery voltage ($V_t$) of the battery during a time interval (t) between the previous time and the current time, and a value ($R_i$) of the internal resistance of the battery wherein at each iteration, the most recently estimated $SOC_{new}$ is used as the $SOC_{old}$ for the next estimation; and
  during an idle phase, stopping the iterative estimation and determining a current idle state of charge $SOC_{idle\_new}$ of the battery as a value associated to a current voltage value ($V_{idle}$) of the battery using a predetermined relation between an open-circuit voltage (OCV) and a state of charge (SOC) of the battery.

2. The method of claim 1, wherein estimating the current state of charge ($SOC_{new}$) comprises estimating a charge provided by or to the battery during the time interval (t) as a function of the battery voltage ($V_t$) and the value ($R_i$) of the internal resistance.

3. The method of claim 2, wherein estimating the charge provided by or to the battery during the time interval (t) comprises determining a value representative of the difference ($V_{diff}$) between the battery voltage ($V_t$) and an open-circuit voltage value ($OCV_t$) of the battery during the time interval (t).

4. The method of claim 3, wherein determining the value representative of the difference ($V_{diff}$) comprises determining the open-circuit voltage ($OCV_t$) of the battery during the time interval (t) as a value associated to the previous state of charge ($SOC_{old}$) in a predetermined relation between the open-circuit voltage (OCV) and the state of charge (SOC) of the battery.

5. The method of claim 1, wherein estimating the current state of charge ($SOC_{new}$) comprises
  making a plurality of measures of the voltage of the battery over the time interval (t); and
  determining the battery voltage ($V_t$) of the battery during the time interval (t) as an average of the plurality of measures.

6. The method of claim 1, further comprising detecting the idle state of the battery by detecting that an electric current provided by or to the battery has dropped below a predefined threshold.

7. The method of claim 1, further comprising determining an improved internal resistance value as a function of: the current idle state of charge ($SOC_{idle\_new}$), and a previous idle state of charge ($SOC_{idle\_old}$) of the battery at a beginning of the charge phase or the discharge phase.

8. The method of claim 7, wherein determining the improved internal resistance value comprises determining an average electric current ($I_{Avg}$) provided by or to the battery during the charge phase or the discharge phase by comparing the current idle state of charge ($SOC_{idle\_new}$) to the previous idle state of charge ($SOC_{idle\_old}$), and dividing a value representative of the difference between the battery voltage (V) and the open-circuit voltage (OCV) during the charge phase or the discharge phase by the average electric current ($I_{Avg}$).

9. The method of claim 7, wherein the internal resistance value ($R_i$) used for estimating the state of charge during a next charge phase or a next discharge phase is the improved resistance value or an average of values including the improved internal resistance value and at least one previously used resistance value.

10. A non-transitory computer readable medium having recorded thereon program steps operative to cause a CPU to determine a current state of charge of a battery having an internal resistance by performing the steps of
  during a charge or discharge phase, iteratively estimating the current state of charge ($SOC_{new}$) of the battery at a current time as a function of a previous state of charge ($SOC_{old}$) of the battery at a previous time, a battery voltage ($V_t$) of the battery during a time interval (t) between the previous time and the current time, and a value ($R_i$) of the internal resistance of the battery wherein at each iteration, the most recently estimated $SOC_{new}$ is used as the $SOC_{old}$ for the next estimation; and
  during an idle phase, stopping the iterative estimation and determining a current idle state of charge ($SOC_{idle\_new}$) of the battery as a value associated to a current voltage value ($V_{idle}$) of the battery using a predetermined relation between an open-circuit voltage (OCV) and a state of charge (SOC) of the battery.

11. An electronic device, comprising:
a battery having an internal resistance;
memory; and
a CPU operatively connected to the memory, the CPU operative to,
during a charge or discharge phase, iteratively estimating the current state of charge ($SOC_{new}$) of the battery at a current time as a function of a previous state of charge ($SOC_{old}$) of the battery at a previous time, a battery voltage ($V_t$) of the battery during a time interval (t) between the previous time and the current time, and a value ($R_i$) of the internal resistance of the battery wherein at each iteration, the most recently estimated $SOC_{new}$ is used as the $SOC_{old}$ for the next estimation; and
during an idle phase, stopping the iterative estimation and determining a current idle state of charge $SOC_{idle\_new}$) of the battery as a value associated to a current voltage value ($V_{idle}$) of the battery using a predetermined relation between an open-circuit voltage (OCV) and a state of charge (SOC) of the battery.

12. The device of claim 11, wherein the device is a mobile communication device, and further comprising:
a transceiver operative to effect wireless communications with a wireless communication network.

\* \* \* \* \*